United States Patent [19]
Berney

[11] Patent Number: 5,703,395
[45] Date of Patent: Dec. 30, 1997

[54] ELECTRONIC MEMORY DEVICE HAVING A NON-PERIPHERAL CONTACT FOR READING AND WRITING

[75] Inventor: Jean-Claude Berney, Les Charbonnières, Switzerland

[73] Assignee: Gay Freres S.A., Geneva, Switzerland

[21] Appl. No.: 557,027
[22] PCT Filed: Apr. 7, 1995
[86] PCT No.: PCT/CH95/00079
§ 371 Date: Dec. 5, 1995
§ 102(e) Date: Dec. 5, 1995
[87] PCT Pub. No.: WO95/28713
PCT Pub. Date: Oct. 26, 1995

[30] Foreign Application Priority Data

Apr. 18, 1994 [CH] Switzerland ............... 1160/94

[51] Int. Cl.[6] ............... H01L 23/02; H01L 23/22; H01L 23/04; H01L 23/34
[52] U.S. Cl. ............... 257/681; 257/678; 257/687; 257/698; 257/727; 257/730; 257/731
[58] Field of Search ............... 257/678, 687, 257/693, 698, 730, 924, 731, 681, 727

[56] References Cited

U.S. PATENT DOCUMENTS

| 4,145,760 | 3/1979 | Ward | 365/226 |
| 4,649,418 | 3/1987 | Uden | 257/678 |
| 4,962,415 | 10/1990 | Yamamoto et al. | 257/723 |
| 5,239,198 | 8/1993 | Cin et al. | 257/693 |
| 5,374,818 | 12/1994 | Bianco et al. | 235/492 |
| 5,389,820 | 2/1995 | Matsuoka | 257/727 |

FOREIGN PATENT DOCUMENTS

| 0 647943 A1 | 4/1995 | European Pat. Off. |
| 2 546 327 | 11/1984 | France |
| 2 655 368 | 6/1991 | France |
| 93-07620 | 4/1993 | WIPO |
| 93-18485 | 9/1993 | WIPO |
| 93-24902 | 12/1993 | WIPO |

OTHER PUBLICATIONS

"Battery Back-up Powered Chip Package," IBM TDB vol. 33 No. 8 Jan. 1991, pp. 393-394.
Pat. Abs. Japan, vol. 8, No. 259, of JP 59-129979-A, publ. 26 Jul. 1984.
Pat. Abs. Japan, vol. 10, No. 38, of JP 60-185284-A, publ. 20 Sep. 1985.
Pat. Abs. Japan, vol. 11, No. 143, of JP 61-281559-A, publ. 11 Dec. 1986.
Pat. Abs. Japan, vol. 12, No. 11, of JP 62-241358-A, publ. 22 Oct. 1987.
Pat. Abs. Japan, vol. 12, No. 411, of JP 63-147212-A, publ. 20 Jun. 1988.
Pat. Abs. Japan, vol. 17, No. 616, of JP 5-189626-A, publ. 20 Jul. 1993.

Primary Examiner—Mahshid D. Saadat
Assistant Examiner—T. M. Arroyo
Attorney, Agent, or Firm—Milton Oliver

[57] ABSTRACT

An electronic miniaturized memory device according to the invention has at least one integrated memory circuit (2,20) and an interconnection interface (3), said memory device comprises a case (1) being a housing for an electronic subsystem (17), said interconnection interface (3) comprises at least one central contact (7,70) for electrically contacting at least one integrated memory circuit (2,20) and said case (1) comprises projecting portion (14) facilitating the attaching of the memory device to a support (8), allowing the memory device to document information relative to the curriculum vitae of the support (8) or to elements in its environment.

15 Claims, 3 Drawing Sheets

ELECTRONIC MEMORY DEVICE HAVING A NON-PERIPHERAL CONTACT FOR READING AND WRITING

BACKGROUND OF THE INVENTION

The invention relates to an electronic memory device and to a method for assembling such a memory device.

At the present there are numerous small devices, generally without an internal power supply, which make use of electronic memories which can be read or read/written by an adequate reading system. Such memory devices can be incorporated into a great number of systems like e.g. chip cards, which are used as means for obtaining money (credit cards, bank cards, etc.), prepayment cards (telephone, coffee machines, parking, etc.), as well as electronic key or electronic label systems. Other applications are boards for electronic apparatus, front panels of instruments, frames for machines, all kind of complex components, etc. Such memory devices can be attached to supports allowing to store information stored within the memory which concern mainly the support. It is desired to have memory devices which can be easily adapted to all kinds of application and which at the same time can assure a protection of fragile electronic elements.

In view of that, several important points are detrimental to the reliability of most of these memory devices and consequently limit their applications.

Firstly, they are installed on plastic supports, which can be easily deformed or destroyed, even with a relatively limited mechanical or thermal stressing. The use of such memory devices is, therefore, limited to applications where their possible destruction would not have particularly harmful consequences.

Secondly, the access to the memory requires several electric contacts, which are a significant and endemic source of poor operation. Frequently the situation is that the memory devices (cards, keys, etc.) can no longer be introduced into the reading device or can no longer be read by the latter.

Thirdly, the possible applications of such memory devices are limited by the extent and by the form often standardized of the supports and of the reading device. The kind of attaching or assembling of said memory devices on the support and the way how to access to the memory drastically restricts the potential field of applications.

The invention aims at providing a solution for these different problems by means of an electronic memory device having a particularly reliable construction and being flexible in the applications.

SUMMARY OF THE INVENTION

According to the invention, this aim is achieved by a miniaturized electronic memory device comprising a case used both as housing and as fixation means for attaching an electronic subsystem to a support. Said subsystem comprises an interconnection interface on which is mounted at least one integrated memory circuit with reading or reading/writing superimposed on the power supply. Said case can be incorporated substantially in its integrity into the support. The case can also fulfill relatively complex tasks and can be integrated mechanically, electronically and functionally within systems.

Said interconnection interface is housed inside an extremity of the case. Said housing is preferably realized by insertion. The interconnection interface is bordered at least partially by a case extremity. The interconnection interface comprises metallized zones arranged so as to ensure, after assembly, connections between the terminals of the at least one integrated memory circuit and a power supply. For doing so, contacts are situated as central contacts on the interconnection interface, and they can be also situated as peripheral contacts on the case.

Preferably, at least one integrated memory circuit is connected electrically and mechanically to one or two surfaces of the interconnection interface, this configuration forms an electronic subsystem. It is also possible to connect a supplementary component, which can be, e.g. another integrated circuit or a power supply. According to the invention, at least one terminal of one integrated memory circuit is connected electrically with at least one central contact of the interconnection interface and at least two terminals of a power supply can be connected electrically with at least two central contacts.

The memory device comprises fixation means and a case extremity which is shaped to attach said electronic subsystem to a support. At least one tubular case portion allows the attaching of the case to a pendant of the support. The pendant is e.g. a hole worked in the support. The hole can be a blind hole or a through hole. The case has preferably a tubular shape. Other shapes are of course possible, provided that they are adapted to the fixation means or to the dimensions of the electronic subsystem.

Preferably, the support is made from electroconductive material but it can be also made from dielectric or from purely conductive materials. Said attaching of the tubular case portion is e.g. realized by deformation of a case extremity or by a threaded joint with a thread zone of the case extremity. The case, after being attached to the support of electroconductive material, can electrically contact the subsystem to said support.

Said construction makes it possible to obtain a robust, miniaturized memory device, which is independently and universally usable and which can be mounted to a huge variety of different supports. The case, therefore, serves simultaneously as mechanical protection, as fixation means on a support and even as electrical contact of the memory device. As a result of its very small dimensions and of its variable fixation means, the memory device according to the invention can be incorporated into a large number of objects without being noticed or without causing any inconvenience as a result of its presence. The memory device can be incorporated integrally into the support. It is conceivable to use a memory device which is dissimulated (hidden) or incorporated into the support though it is electronically insulated from the support. The case, in order to guarantee an additional dissimulation or protection, can be covered by e.g. a detachable cover or clip, allowing temporary cover.

The memory device can contain information relating to the object in which it is incorporated or to the person carrying the object. Said information can give details on the source or ownership of the object. Said information can give details concerning the identity or status of the person. The memory device serves, therefore, as a curriculum vitae of the support or of the object, being able to memorize important information. Generally spoken, the memory device serves as a memory keeper of elements in its environment. The memory device is especially adapted to be incorporated into printed circuit boards as supports. The memory device, therefore, must not necessarily be incorporated but simply has to be attached to an object. The memory device, being

3 accessible to reading/writing and to a power supply, keeps information relative to the status of the printed circuit boards during both their production process and their future application. The memory device, by help of a detachable cover or by a detachable clip, is protected while passing hostile environments during its production process or its future application.

BRIEF DESCRIPTION OF THE DRAWINGS

The invention is described in greater detail hereinafter relative to the attached drawings, wherein show.

DESCRIPTION OF THE PREFERRED EMBODIMENTS

Figure 1:
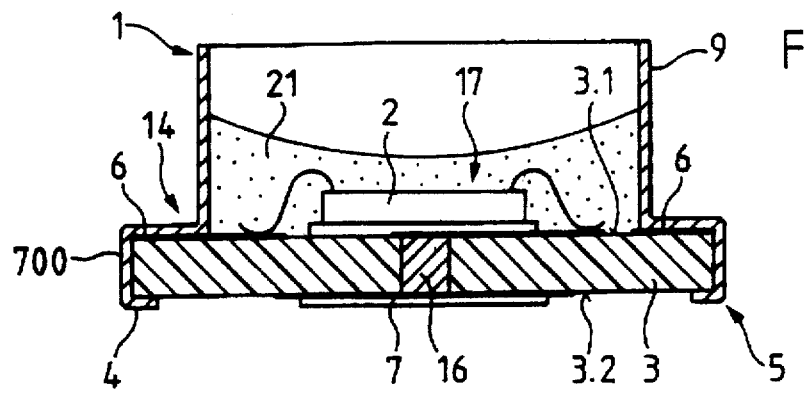
FIG. 1 shows a schematic side view of a first preferred embodiment of the memory device according to the invention, having an electronic subsystem comprising one integrated memory circuit.

FIG. 1 shows a schematic side view of a first preferred embodiment of the memory device according to the invention. A case 1 comprises an interconnection interface 3 and an integrated memory circuit 2 is electrically connected and mechanically to said interconnection interface 3. The interconnection interface 3 and the integrated memory circuit 2 constitute an electronic subsystem 17. The integrated memory circuit 2 being inside said case 1 is mounted on an upper surface of the interconnection interface 3 and covered by a protection layer 21. The interconnection interface 3 is bordered by the case 1.

Said case 1 being made from electroconductive material is used as housing for the integrated memory circuit 2. Said case 1 can be made from e.g. metal or from a dielectric material with or without conductor paths. This first preferred embodiment of a case 1 has a circular symmetry (see FIG.

4

5) and is provided with a projecting portion 14. The case 1 comprises, therefore, a first ductile extremity 4 having a larger diameter as compared to a second ductile extremity 9 having a comparably smaller diameter. The first ductile case extremity 4 allows to fix the electronic subsystem 17 on the case 1 while the second ductile case extremity 9 allows to attach at least a tubular case portion to a pendant of a support. Said pendant can be e.g. a hole worked in the support. Said hole can be a blind hole or a through hole. This case configuration is very reliable and compact, allowing a highly miniaturized execution of the memory device according to the invention. The diameter of said case 1 amounts to approximately 4 millimeters and its height to approximately 1.6 millimeters. Said tubular case can be manufactured by known shaping methods.

Said interconnection interface 3 can be a printed circuit comprising metallized zones on one or two of its surfaces. According to FIG. 1, the integrated memory circuit 2 is mounted on an upper surface 3.1. The interconnection interface 3 is basically made from plastic material, and is e.g. a thin foil of polyimide having metallized zones.

Said integrated memory circuit 2 comprises inputs/outputs terminals, which can be connected by means of electric conductors (bonding) to metallized zones of said interconnection interface 3. These connections can be also realized by thermocompression (bumps) or by means of any other known method. At present integrated memory circuits 2 of the EEPROM (Electrically Erasable Programmable Read-Only Memory) type are known, which can be read or read/written directly onto the supply terminals. Although these integrated memory circuits 2 are not well known, no details of their operation will be given here, because forming the subject matter of specific patent applications. It is sufficient to know that these integrated memory circuits only require two electrical terminals, a first terminal connected to earth or ground, and the second terminal.

A first terminal of the integrated memory circuit 2 is connected to a central contact 7 situated on the lower surface 3.2 by means of a traversing metallized hole 16. The second terminal of the integrated memory circuit 2 is connected to a case portion 6 and to a peripheral case contact 700. Said peripheral contact 700 is electrically conductive and accessible from outside of the memory device. In this configuration, a reading system can consequently access to the two terminals of the integrated memory circuit 2 by establishing two contacts, one with the central contact 7 of the interconnection interface 3 and the other with the peripheral contact of the case 1.

Said interconnection interface 3 is bordered by at least one fixation portion 5 of a ductile extremity 4 of the case 1. Said insertion can be effectuated after connecting the integrated memory circuit 2 to the metallized zones of the interconnection interface 3. Preferably, said interconnection interface 3 is partially bordered by a tubular case portion (see FIG. 5). Moreover, by selecting a ductile material for the connection of a terminal of the integrated memory circuit 2 to a case portion 6, by e.g. choosing gold or silver as contacting material, said connection to a case portion 6 is realized quasi automatically under the insertion pressure and without the need of a welding. The integrated memory circuit 2 can be covered by a protection layer 21, once the interconnection interface 3 is housed within the case 1. Said protection layer 21 can be e.g. a droplet of glue or a cured resin.

The memory device according to the invention offers several advantages as compared to an existing and similar memory device which is published in the international application PCT/CH93/00133 filed May 24, 1993. This electronic label is not provided with the advantages of a tubular case but offers the inconvenient of a complicate assembling process because of needing glue fixations for interconnecting the different elements. Moreover, the present invention possess the advantage that a lower surface 3.2 of the interconnection interface 3 is accessible in its entity from outside of the memory device. This feature allows the realization of a plurality of metallized holes traversing the interconnection interface 3 accessible from outside of the memory device (see FIGS. 2, 3 and 4).

The case 1, therefore, fulfills an electrical function serving as electric contact, and it fulfills a mechanical function assuring a reliable construction for the integrated memory circuit 2 and the central contact 7. The following figures will show other and more detailed electrical and mechanical case functions.

Figure 2:
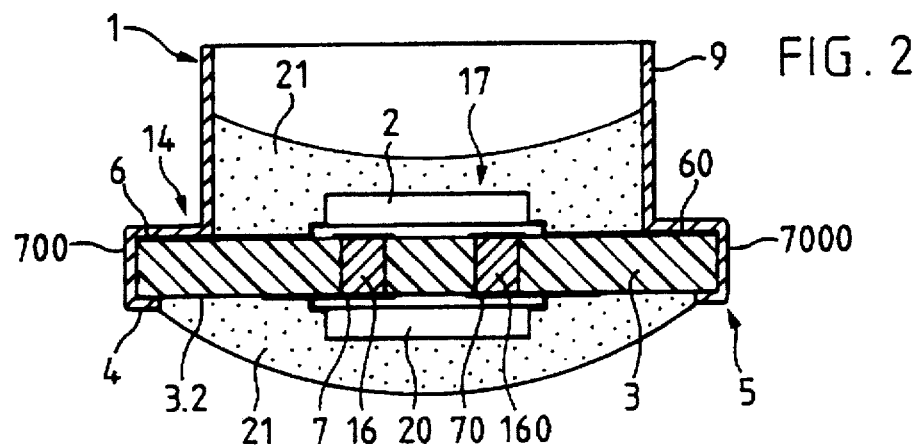
FIG. 2 shows a schematic side view of a second preferred embodiment of the memory device according to the invention, having an electronic subsystem comprising two integrated memory circuits.

FIG. 2 shows a schematic side view of a second preferred embodiment of the memory device according to the invention, comprising an integrated memory circuit and a supplementary component, being a second integrated memory circuit. The first and second preferred embodiment are similar in most of the details and reference is made to the description of FIG. 1. The following discussion is, therefore, restricted to differences as compared to the embodiment shown in FIG. 1.

The supplementary component can be any active or passive electronic element. According to the preferred embodiment, the supplementary component is a second integrated memory circuit 20, but it can be also a control circuit or a silicon input/output interface. Said two integrated memory circuits 2,20 are connected by thermocompression to opposite surfaces of the interconnection interface 3, the integrated memory circuit 2 is connected to an upper surface 3.1, the integrated memory circuit 20 is connected to a lower surface 3.2. Each of the integrated memory circuits 2,20 are covered by a protection layer 21. The two integrated memory circuits 2,20 and the interconnection interface 3 form an electronic subsystem 17.

The second preferred embodiment of a memory device according to the invention comprises an integrated memory circuit 2 having two supply terminals which are connected to two central contacts 7,70 of the upper surface 3.1 and it comprises a second integrated memory device 20 which two supply terminals are connected to two central contacts 7,70 of the lower surface 3.2. Said two central contacts 7,70 of the lower surface 3.2 are connected to central points 7,70 of the upper surface 3.1 by means of metallized holes 16,160 traversing the interconnection interface 3. The two central points 7,70 of the upper surface 3.1 are connected to two case portions 6,60, which two case portions 6,60 are connected to two peripheral contacts 700,7000 of the case. Said two peripheral contacts 700,7000 are separated from each other and both electrically conductive and accessible from outside of the case 1.

A reading system has, therefore, access to the two supply terminals of the integrated memory circuits 2,20 by contacting the two peripheral contacts 700,7000 of the case 1. According to the invention, it is of course possible to connect more than two central contacts 7,70 and to connect more than two integrated memory circuits 2,20 to more than two peripheral contacts 700,7000 using an interconnection interface 3.

Figure 3:
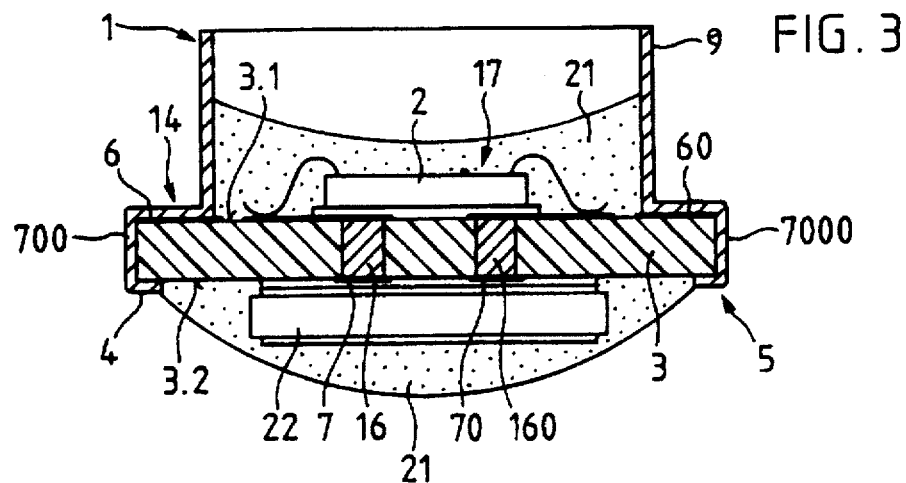
FIG. 3 shows a schematic side view of a third preferred embodiment of the memory device according to the invention, having an electronic subsystem comprising a integrated memory circuit and a supplementary component.

FIG. 3 shows a schematic side view of a third preferred embodiment of the memory device according to the invention, comprising an integrated memory circuit and a supplementary component, being a power supply. As there is a great similarity to the details shown in the first and second preferred embodiments, reference is made to the description of FIGS. 1 and 2. The following discussion is restricted to differences thereto.

Said integrated memory circuit 2 and said power supply 22 are mounted on opposite surfaces of the interconnection interface 3, the integrated memory circuit 2 is connected to the upper surface 3.1, the supplementary component 22 is connected to the lower surface 3.2. Both, the integrated memory circuit 2 and the power supply 22 are covered by a protection layer 21. The integrated memory circuit 2, the power supply 22 and the interconnection interface 3 form an electronic subsystem 17.

The third preferred embodiment of a memory device according to the invention comprises an integrated memory circuit 2 having two supply terminals which are connected to two central contacts 7,70 of the upper surface 3.1. The two central points 7,70 of the upper surface 3.1 are connected to two case portions 6,60, which two case portions 6,60 are connected to two peripheral contacts 700,7000 of the case. Said two peripheral contacts 700,7000 are separated from each other and both electrically conductive and accessible from outside of the case 1. Said two central contacts 7,70 of the upper surface 3.1 are connected to central points 7,70 of the lower surface 3.2 by means of metallized holes 16,160 traversing the interconnection interface 3. The power supply 22 having two supply terminals which are connected to two central points 7,70 of the lower surface 3.2 allows a power supply of the integrated memory circuit 2. A reading system has access to the two terminals of the integrated memory circuit 2 by contacting the two peripheral contacts 700,7000 of the case 1.

Said construction offers the advantage having a supplementary component which is a power supply. Such a power supply can be e.g. a coil or an accumulator comprising a electric current stabilizing system. A man skilled in the art, knowing the present invention can realize a huge variety of different power supplies.

The two terminals of the integrated memory circuit 2 and the two supply terminals of the power supply 22 are connected electrically, allowing to power supply the integrated memory circuit 2, increasing therefore, the performance and independence of the memory circuit according to the invention.

Moreover, it is possible to avoid the realization of peripheral contacts 700,7000 of the case 1 and to use power supply 22, being e.g. a radiofrequency coil enabling the power supply to said integrated memory circuit 2 and enabling the reading/writing of said integrated memory circuit 2, allowing the memory device to document information relative to the curriculum vitae of the support.

Figure 4:
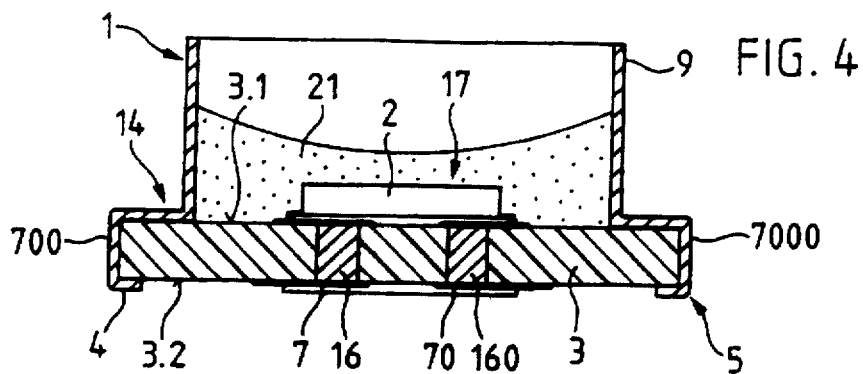
FIG. 4 shows a schematic side view of a fourth preferred embodiment of the memory device according to the invention, having an electronic subsystem comprising one integrated memory circuit.

FIG. 4 shows a schematic side view of a fourth preferred embodiment of the memory device according to the invention, comprising an integrated memory circuit. As there is a great similarity to the details shown in the preceding preferred embodiments, reference is made to the description of the corresponding figures and only differences thereto will be discussed.

The fourth preferred embodiment of a memory device according to the invention comprises an integrated memory circuit 2 and an interconnection interface 3 which form an electronic subsystem 17. The integrated memory circuit 2 having two supply terminals which are connected to two central contacts 7,70 of the upper surface 3.1. The two central points 7,70 of the upper surface 3.1 are connected to two central points 7,70 of the lower surface 3.2 by means of metallized holes 16,160 traversing the interconnection interface 3. Said two central contacts 7,70 of the lower surface 3.2 are separated from each other and both electrically conductive and accessible from outside of the case 1, enabling the power supply and the access of the reading/writing system to said integrated memory circuit 2.

Figure 5:
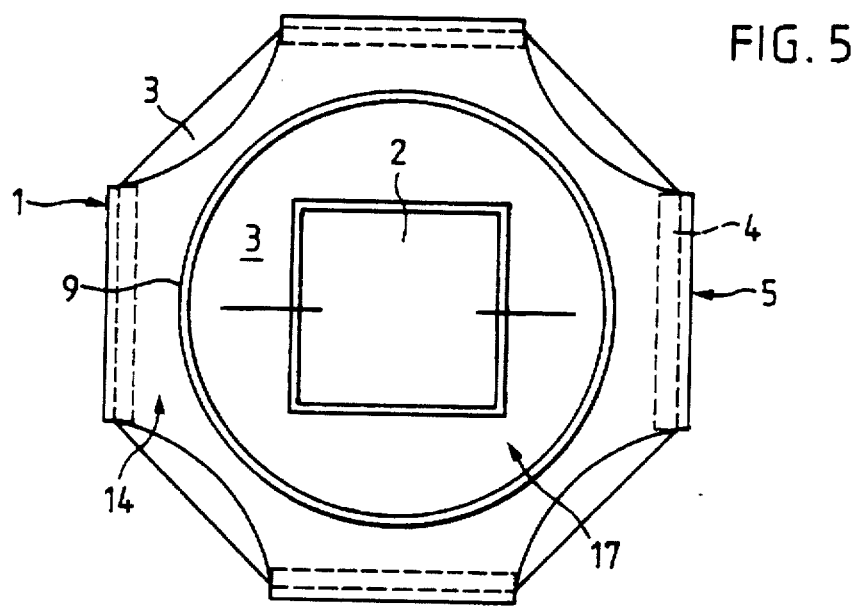
FIG. 5 shows a top view of the first preferred embodiment of the memory device according to FIG. 1, demonstrating the partial insertion of the interconnection interface of the electronic subsystem.

FIG. 5 shows a top view of the first preferred embodiment of the memory device according to FIG. 1, demonstrating the insertion of the electronic subsystem 17 using the interconnection interface 3. The interconnection interface 3 is bordered at least partially by a tubular fixation portion 5 of a ductile case extremity 4. Said fixation portion 5 is e.g. a clamping profile (bent-over flange, allowing the insertion of the interconnection interface 3. Said insertion represents a method being well known, proven, reliable and solid.

Figure 6:
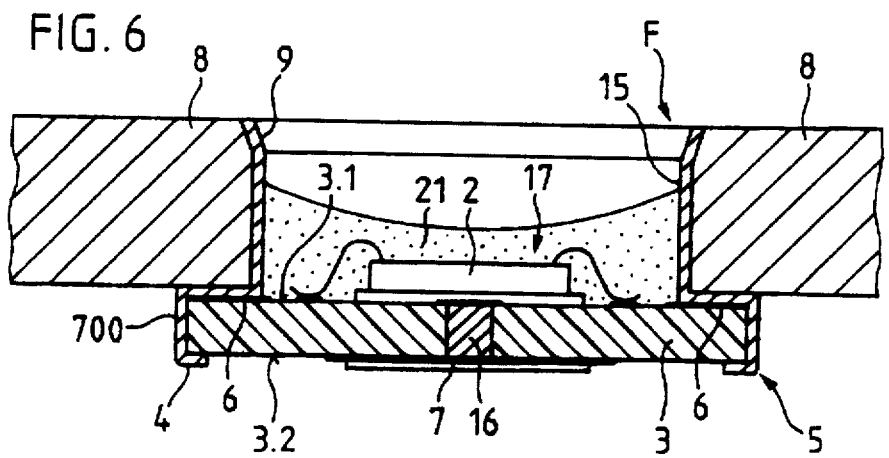
FIG. 6 shows a side view of the first preferred embodiment of the memory device according to FIG. 1, having a case attached by a rivet joint to the support.

FIG. 6 shows a side view of the first preferred embodiment of the memory device according to FIG. 1, having a case attached by a rivet joint to the support. Said case 1 comprises a projecting portion 14, facilitating the attaching of the memory device to the support 8. Said case 1 comprises a ductile extremity 9 for an rivet joint to said support 8. Said support 8 is made preferably from electroconductive material. The case 1, after being attached to the support 8, allows an electric contact in between the interconnection interface 3 and the support 8 made from electroconductive material. The fixation means F consists, therefore, in deforming said ductile case extremity 9 in a hole 15 worked in the support 8. A rivet joint is a method well known in the art.

Figure 7:
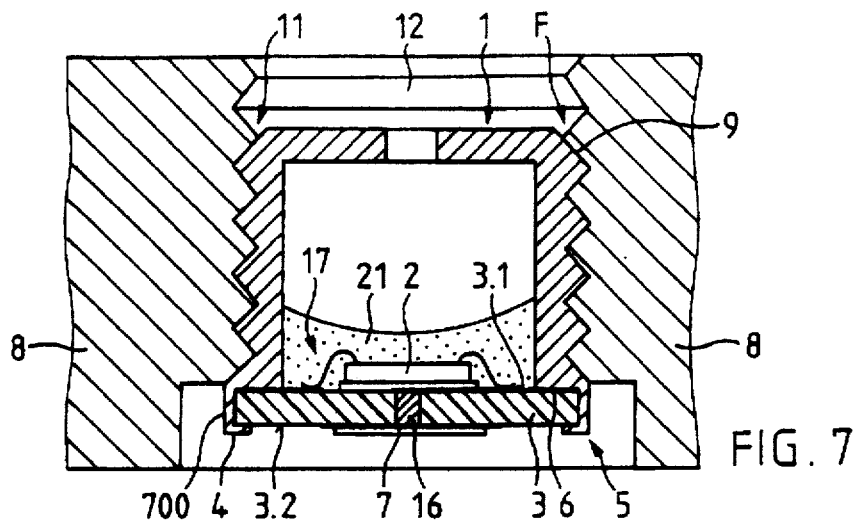
FIG. 7 shows a side view of a fifth preferred embodiment of the memory device according to the invention, having an integrated memory circuit attached by a threaded joint to the support.

FIG. 7 shows a side view of a fifth preferred embodiment of the memory device according to the invention, comprising an integrated memory circuit and a case attached by a threaded joint to the support. The first and fifth preferred embodiment are similar in most of the details and reference is made to the description of FIG. 1. The following discussion is restricted to differences as compared to the embodiment shown in FIG. 1.

The case 1 according to FIG. 7 comprises a thread zone 11 for a threaded joint in a threaded hole 12 of the support 8. Said support 8 is made preferably from electroconductive material. The threaded joint as fixation means F allows an electric contact in between the interconnection interface 3 and, traversing the case 1, said support 8 made from electroconductive material.

The case 1 and its thread zone 11 can be obtained for example by machining. Said machining off as manufacturing technique and said threaded joint as fixation means F are well known in the art.

The memory device according to the invention, as a result of its very small dimensions and of its variable fixation means, can be incorporated into a large number of objects without being noticed or without causing any inconvenience as a result of its presence. It is possible, as shown by FIG. 7, to incorporate and to dissimulate the memory device integrally into the support 8.

Figure 8:
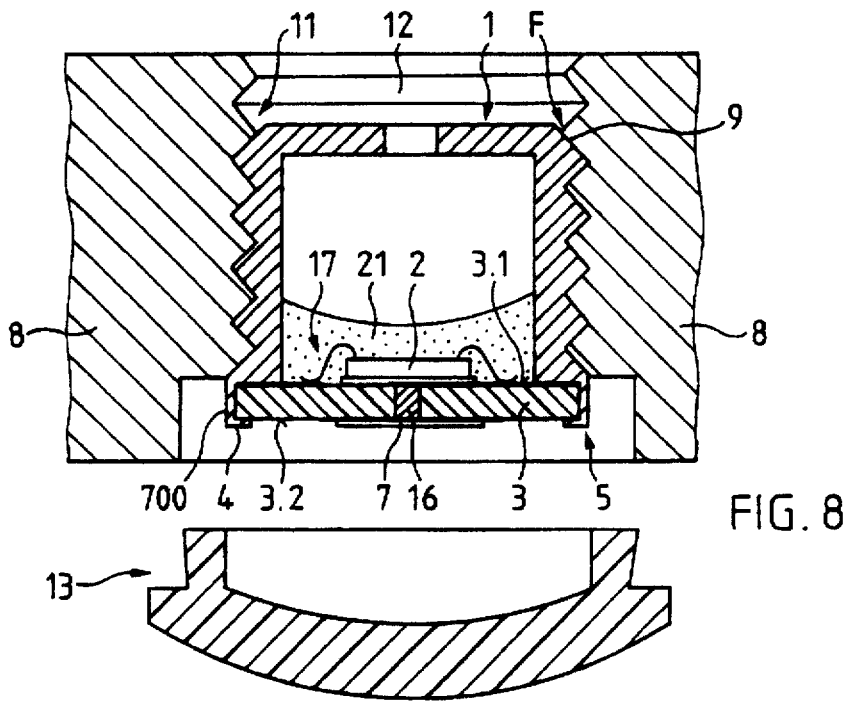
FIG. 8 shows a side view of the fifth preferred embodiment of the memory device according to FIG. 7, being mounted on a support and having a detachable cover.

FIG. 8 shows a side view of the fifth preferred embodiment of the memory device according to FIG. 7, being mounted on a support and having a detachable cover, permitting a temporary covering of the memory device. Said detachable cover 13 is e.g. made from metal or from plastic material. As shown by FIG. 8, the detachable cover 13 has a circular symmetry and is shaped in such a way, that it permits covering the memory device in its totality and in that it can be detached easily.

Said memory device which is miniaturized, reliable, independent and universally usable, can be attached, using the case 1, to a huge variety of different supports. The detachable cover 13 permitting covering the memory device bear at least two advantages:

Firstly, the memory device can be dissimulated quasi totally using the detachable cover 13. Said dissimulated memory device keeps information relating to the object in which it is incorporated or relating to a person carrying the object. Said information can give details on the source or ownership of the object. Said information can give details concerning the identity or status of the person.

Secondly, the memory device can be provided with an additional protection, being e.g. said detachable cover 13. Said additional protection can be of great importance, for example for a memory device being an indicator incorporated into a printed circuit board as support. The memory device, being an indicator keeps information relative to the status of the printed circuit board during both the production process. Said additional protection is of importance, because it protects the memory device while passing hostile environments during the printed circuit board production process, for example during welding operations of components, during furnace passages, etc. The detachable cover 13 is easily detached, allowing a rapid access to the memory device.

The invention claims the use of the memory device wherein said memory device is incorporated into a support 8 being a printed circuit board and wherein said memory device is accessible reading/writing and to a power supply, allowing the memory device to document information relative to the printed circuit boards during their production process and their future application.

Figure 9:
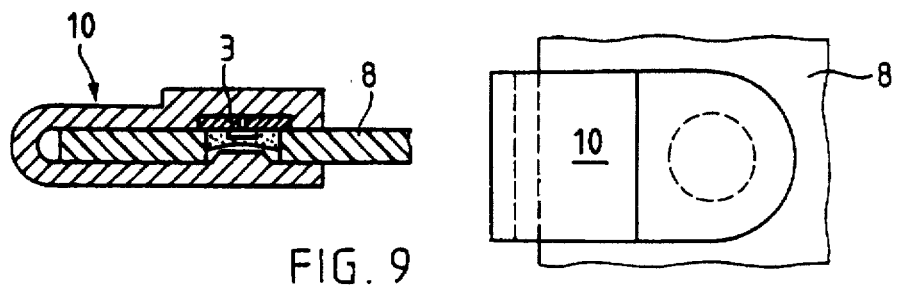
FIG. 9 shows a side view (on the left) and a top view (on the right) of the first preferred embodiment of the memory device according to FIG. 6, being mounted on a support and having a detachable clip.

FIG. 9 shows a side view (on the left) and a top view (on the right) of the first preferred embodiment of the memory device according to FIG. 6, being mounted on a support and having a detachable clip 10, allowing a temporary cover of the memory device. Said detachable clip 10 is e.g. made from metal or from plastic material. As shown by FIG. 9, the detachable clip 10 has a circular symmetry and is shaped in such a way, that it permits covering the memory device in its totality and in that it can be detached easily, for example, by help of spring device which is detachably incorporated within the detachable clip 10. Said detachable clip 10 and said detachable cover 13 fulfill similar functions. Reference is made to the description of the detachable cover 13 according to FIG. 8.

There exist of course other possible embodiments of the memory device according to the invention. However, for the comprehension of the latter, it is not necessary to describe any supplemental elements.

I claim:

1. An electronic miniaturized memory device, comprising
at least one integrated memory circuit (2,20),
an interconnection interface (3) connected to said integrated memory circuit,
a case (1) surrounding and serving as a protective housing for an electronic subsystem (17), and
fixation means, selected from the group consisting of a screw and a rivet, for attaching said memory device to a support,
wherein said interconnection interface includes at least one peripheral contact (700) and a second, non-peripheral, contact (7,70), adapted for use in writing information to, and reading information from, the memory device, thereby allowing the memory device to document information concerning the specific support to which it is attached.

2. A memory device according to claim 1, wherein said case (1) comprises a tubular case portion.

3. A memory device according to claim 1, wherein said case (1) comprises a thread zone (11) for a threaded joint of the memory device to said support (8).

4. A memory device according to claim 1, wherein said case (1) comprises a projecting portion (14) facilitating the attaching of the memory device to said support (8) and said case (1) comprises a ductile extremity (9) forming an at least partial rivet joint with said support (8).

5. A memory device according to claim 1, wherein at least one integrated memory circuit (2,20) and a supplementary component (22) are electrically and mechanically connected to opposite surfaces of said interconnection interface (3) forming an electronic subsystem (17).

6. A memory device according to claim 5, wherein said supplementary component is a power supply (22) and wherein terminals of at least one integrated memory circuit (2,20) are electrically connected to at least two central contacts (7,70) of said interconnection interface (3).

7. A memory device according to claim 6, wherein said power supply (22) is a radiofrequency coil providing a supply of power to said at least one integrated memory circuit (2,20) and enabling the reading/writing of said at least one integrated memory circuit (2,20).

8. A memory device according to claim 1, wherein said interconnection interface (3) is bordered at least partially by a fixation portion (5) of the case (1).

9. A memory device according to claim 8, wherein said fixation portion (5) is a clamping bent-over flange of a ductile case extremity (4).

10. A memory device according to claim 8, wherein said fixation portion (5) forms at least one electrical contact (6) with a metallized zone of said interconnection interface (3), enabling at least one electrical connection of said at least one integrated memory circuit (2,20) to at least one peripheral contact (700,7000) of said case (1).

11. A memory device according to claim 1, wherein at least one terminal of said at least one integrated memory circuit (2,20) is electrically connected to at least one central contact (7,70) of said interconnection interface (3).

12. A memory device according to claim 1, wherein said at least one integrated memory circuit (2,20) is accessible for reading or reading/writing and for the supply of power by means of at least one central contact (7,70) of said interconnection interface (3) and by means of at least one peripheral contact (700,7000) of said case (1).

13. A memory device according to claim 1, further comprising a detachable clip (10) which conceals the memory device.

14. A memory device according to claim 1, further comprising a detachable cover (13) which conceals the memory device.

15. A method of using a miniaturized memory device having at least one integrated memory circuit (2,20), an interconnection interface (3) connected to said integrated memory circuit, a case (1) surrounding, and serving as a protective housing for, an electronic subsystem (17), and fixation means for attaching said memory device to a support (8), wherein said interconnection interface (3) includes at least one peripheral contact (700) and a second, non-peripheral, contact (7,70), adapted for use in writing information to, and teasing information from, the memory device, comprising the steps of securing said memory device to a support (8) in the form of a printed circuit board and applying voltage signals to said contacts, thereby writing into said memory device, allowing the memory device to document information concerning the specific printed circuit board to which it has been secured.

\* \* \* \* \*